United States Patent
Yoshida et al.

(10) Patent No.: US 6,523,701 B1
(45) Date of Patent: Feb. 25, 2003

(54) ELONGATED RIB FOR CASSETTE AND SUBSTRATE CASSETTE

(75) Inventors: Toshio Yoshida, Higashi-Osaka (JP); Yuji Amano, Ibaraki (JP); Taimi Oketani, Osaka (JP); Masayuki Tsuji, Osaka (JP); Isao Saraoka, Osaka (JP)

(73) Assignees: Yodogawa Kasei Kabushiki Kaisha, Osaka (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/655,872

(22) Filed: Sep. 6, 2000

(30) Foreign Application Priority Data

Sep. 6, 1999 (JP) .......................... 11-251731

(51) Int. Cl.$^7$ .............................................. A47G 19/08
(52) U.S. Cl. ..................................... 211/41.18; 206/454
(58) Field of Search .................... 211/41.18, 41.21, 211/191, 123; 206/454

(56) References Cited

U.S. PATENT DOCUMENTS

| | | | | |
|---|---|---|---|---|
| 4,228,902 A | * | 10/1980 | Schulte | 211/41.1 |
| 4,872,554 A | * | 10/1989 | Quernemoen | 206/454 |
| 6,273,275 B1 | * | 8/2001 | Kim et al. | 211/41.18 |
| 6,171,400 B1 | * | 1/2002 | Wingo | 118/500 |
| 6,186,344 B1 | * | 2/2002 | Park et al. | 211/41.1 |

FOREIGN PATENT DOCUMENTS

| | | | |
|---|---|---|---|
| JP | 2295150 | | 12/1990 |
| JP | 3133152 | | 6/1991 |
| JP | 5147680 | | 6/1993 |
| JP | 6247483 | | 9/1994 |
| JP | 626812 | | 10/1994 |
| JP | 9-36219 | | 2/1997 |
| JP | 10-218632 | * | 8/1998 |
| JP | 11-11573 | * | 11/1999 |

* cited by examiner

*Primary Examiner*—Ramon O. Ramirez
(74) *Attorney, Agent, or Firm*—Armstrong, Westerman & Hattori, LLP

(57) ABSTRACT

A cassette for supporting substrates and an elongated rib therefor is described and represents a further improvement in the previously proposed elongated rib systems of the prior art and is designed particularly to preclude deflection and dampen vibrations of loaded substrates. The elongated ribs for the cassette project from side panels utilizing an elongated rib structure including three segments; namely, a base resin body, a bar-like intermediate resin body extending from the base resin body, and a terminal resin body disposed at the forward end of the intermediate resin body. Preferably, the elongated rib structure includes a linear reinforcing member inserted from the base resin body to the intermediate resin body or, alternatively, from the base resin body through the intermediate resin body to the terminal resin body.

13 Claims, 13 Drawing Sheets

ELONGATED RIB FOR CASSETTE AND SUBSTRATE CASSETTE

FIELD OF THE INVENTION

The present invention relates to acassette for supporting substrates and, in particular, to a cassette for effectively precluding the deflection and vibrations of even large-sized substrates during the loading or unloading thereof with respect to the substrate, and to an elongated rib structure for the cassette.

PRIOR ART

In handling substrates, such as glass substrates, it is necessary to stow, hold and take out the substrates without allowing them to be placed in contact with each other.

The cassette of this type in common use today is a box-like structure having a pair of opposed side walls each containing grooved side panels so that substrates may be removably inserted into the spaces defined by the grooves in the respective side panels. The geometry of the grooved panel may be varied but all available side panels have basically the same construction; namely, a plurality of parallelly disposed rib-like shelves which project inwardly from thickened parts of a pair of predetermined pitch. A substrate can thus be removably inserted into the space between the adjacent rib-like shelves.

The distance the extending rib-like shelves of grooved side panels project in substrate cassettes available today is generally about 10 mm, and even in the case of a cassette for large-sized glass substrates, the distance of projection of the rib-like shelves is generally about 16 mm or less.

Among known cassettes ofthe above type arethe cassettes described in JP Kokai H2-2195150, JP Kokai H3-133152, JP Kokai H5-147680, JP Kokai H6-247483 and JP Kokai H6-286812, all according to the applications filed by the present applicant.

In JP Kokai H9-36219, one of the present applicants proposes a cassette having grooved side panels equipped with rib-like shelves extending over a markedly increased distance; more particularly, a cassette such that the distance of projection of the shelves of its side panels is 1/10 to 1/4 of the effective width of the cassette. This published patent application not only proposes such prolongation of rib-like shelves of grooved side panels but also proposes an embodiment in which additional elongated ribs extend from the receiving frame (stopper) in the innermost part of the cassette.

Glass substrates in general use are from 0.7 mm to 1.1 mm in thickness, and substrates with athickness of 0.5 are also coming into popular use. Moreover, substrates as thin as 0.4 mm or 0.3 mm have also come into use recently. Glass substrates are available in various sizes and, while substrates measuring 360 mm to 400 mm in width had formerly constituted a large majority, recently substrates ofmore than 500 mm wide to about 800 mm wide, and even those as wide as about 1000 mm or more have come into use. (Incidentally, the length (depth) of the glass substrate is generally equal to the width thereof, or greater.)

Even though glass substrates have excellent rigidity, deflection of a large-sized substrate during loading/unloading of a cassette therewith cannot be disregarded. According to an article at pages 69 to 71 in Monthly LCD Intelligence, 1997.5, the gravitational deflections of glass substrates varying in size and thickness are as shown in Table 1.

TABLE 1

| Glass Substrate Size (mm) | Weight (g) | Gravitational Deflection (mm) |
| --- | --- | --- |
| 550 × 650 × 1.2 | 983 | 3.94 |
| 650 × 830 × 1.1 | 1484 | 7.69 |
| 1000 × 1000 × 1.1 | 2750 | 43.0 |
| 550 × 650 × 0.7 | 626 | 9.92 (9.45) |
| 650 × 830 × 0.7 | 944 | 19.0 (18.8) |
| 1000 × 1000 × 0.7 | 1750 | 106.8 |

(The figure in parentheses in the gravitational deflection column denotes a measured value.)

As deflection progresses, the smooth insertion and take-out of cassettes are hindered unless the shelf-to-shelf pitch for each stage is increased, but if the pitch is increased, the number of glass substrates which can be accommodated per cassette will be inevitably decreased. If the number of glass substrates to be cassetted is to be kept up to the same numbers as previously, it is necessary to manufacture larger cassettes. Moreover, if a substantial deflection takes place, damage to the glass substrate during cassetting will become a problem which cannot be disregarded.

Compared with earlier cassettes, the long-ribbed cassette described in JP Kokai H9-36219 referred to above represents a marked improvement in the prevention of substrate deflection. However, since the rib-like shelves are made ofresin and are increased in length, the free ends of the shelves are slightly deflected downward when they are loaded with the substrate and the resultant vibration, once produced, is not readily attenuated so that the quality of the substrate tends to be adversely affected in various ways.

SUMMARY OF THE INVENTION

In the above state of the art, the object of the present invention is to provide a substrate cassette and an elongated rib for use in the cassette which reflects improvements in the above long-rib system described in JP Kokai H9-36219 and is adapted to effectively prevent said deflection and vibrations even when the cassette is loaded with large-sized substrates.

Accordingly, the elongated-rib structure for a cassette according to the present invention is an elongated rib 3 to be installed as projecting inwardly of a box-shaped skeletal cassette frame 1 from a pair of side panels 2, 2 disposed at two opposed sides of said frame 1 for supporting a substrate, said elongated rib 3 being a three-member structure including:

a base resin body 31, an elongatedbar-like intermediate resinbody 33 disposed-toprojectfrom the forward end of said base resin body 31, and a terminal resin body 34 provided at the forward end of said intermediate resin body 33.

In the preferred embodiment, a linear reinforcing member 32 is inserted from the base resin body 31 to the intermediate body 33 or from the base resin body 31 through the intermediate resin body 33 to the terminal resin body 34.

The present invention is further directed to a substrate cassette comprising a box-shaped skeletal frame 1 and side panels 2, 2 disposed at a pair of opposite sides of said box-shaped skeletal frame 1, a plurality of elongated ribs 3 extending inwardly of said frame 1 from said side panels 2, 2 for supporting substrates B, each of said elongated ribs 3 comprising a three-member structure comprising:

a base resin body 31, an elongatedbar-like intermediate resin body 33 disposedto project from the forward end of said base body 31, and a terminal resin body 34 provided at the forward end of said intermediate resin body 33.

In this embodiment, too, itis preferred that alinear reinforcing member 32 is inserted from the base resin body 31 to the intermediate resin body 33 or from the base resin body 31 through the intermediate resin body 33 to the terminal resin body 34.

DETAILED DESCRIPTION OF THE PREFERRED EMBODIMENTS OF THE INVENTION

The present invention is now described in detail.

Figure 5:
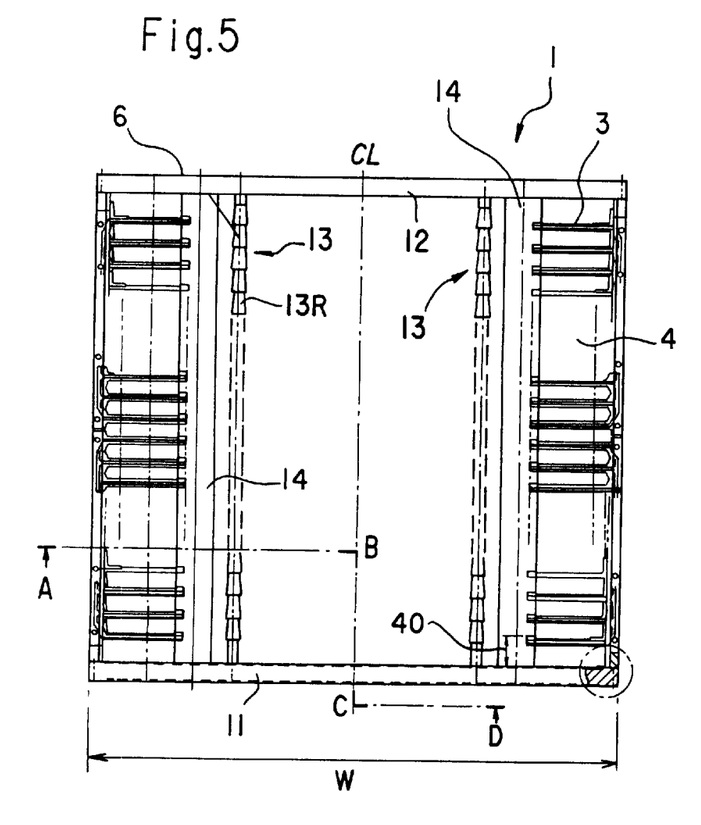
FIG. 5 is a front view of an exemplary substrate cassette of the present invention.
Figure 6:
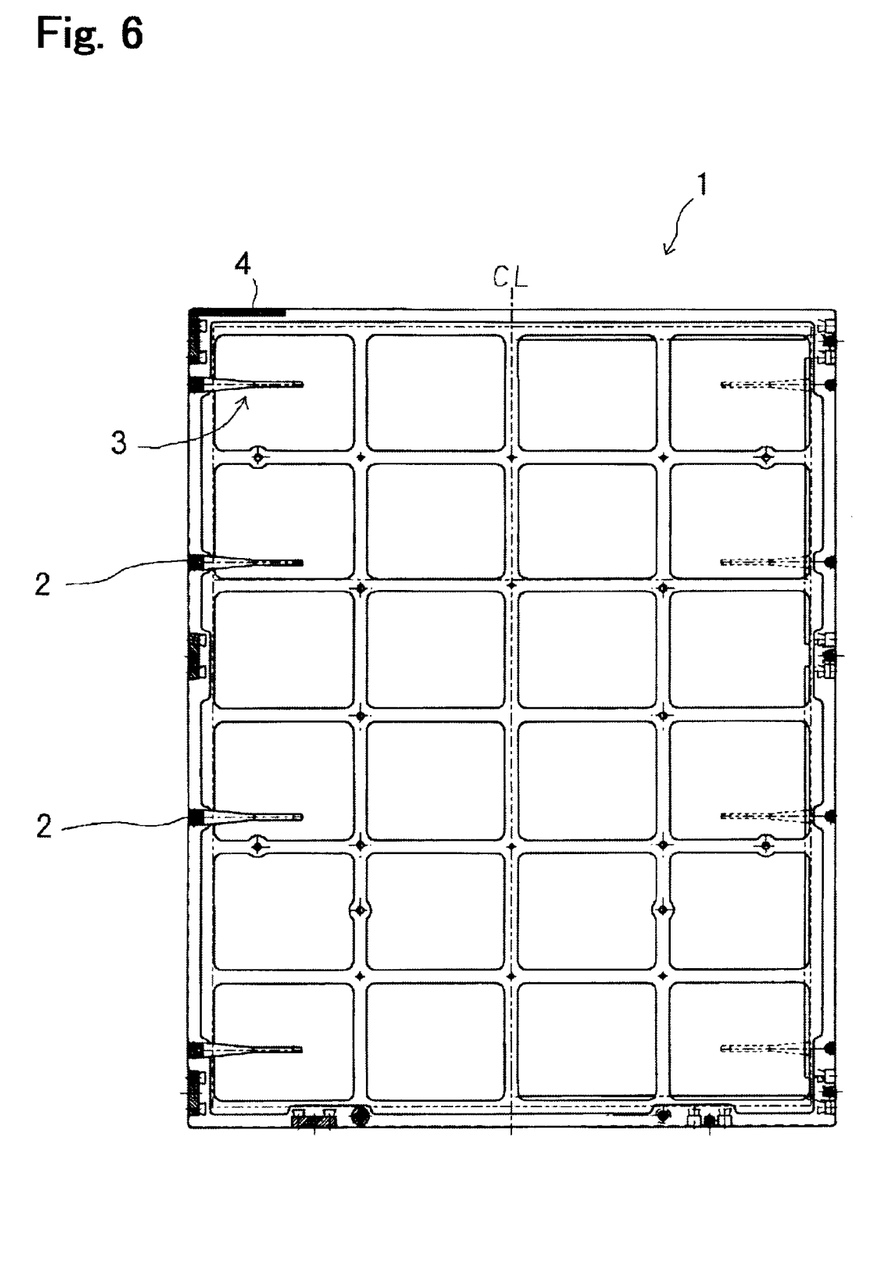
FIG. 6 is a sectional view taken along the line A-B-C-D of FIG. 5.

In providing a substrate cassette of the present invention, as shown in FIGS. 5 and 6, a box-shaped skeletal frame 1 contains a plurality of member frames fitted with side panels 2 a teach of a pair of opposed sides thereof. The frame 1 generally comprises a bottom frame 11, a top or ceiling frame 12, a back stopper or receiving frame or frames 13, and a supporting frame or frames 14 bridging the bottom frame 11 and the ceiling frame 12. The material ofwhich the frame 1 is made may be any of synthetic resins, metals and metal-resin composites. A grid construction is generally adopted for both the bottom frame 11 and ceiling frame 12 but for protection against contamination with dust, the bottom frame 11 may be covered with a cover plate 5 attached to its upper surface and the ceiling frame 12 fitted with a cover plate 6 attached to its upper surface. Among the above-mentioned component members, the supporting frame 14 may be omitted when the side panels 2, 2 are expected to discharge the function of the supporting frame as well.

The stopper frame 13 is not particularly restricted but may be any suitable structure capable of preventing the substrates from slipping down from the back side of the cassette. Generally, the stopper frame is a plate- or bar-like frame disposed in a vertical direction. When such a frame is used, the frame is preferably formed with ribs 13R at the same pitch as the elongated ribs 3. The distance of projection of the ribs 13R may, for example, be as short as about 10 mm or as long as the distance of projection L of the elongated ribs 3, or even longer.

A pair of two opposed sides of the cassette are constituted by side panels 2, 2. At least two side panels 2 are required per side of the box-shaped structure but generally about 3 to 8 panels, preferably about 4 to 6 panels are employed.

Figure 2A:
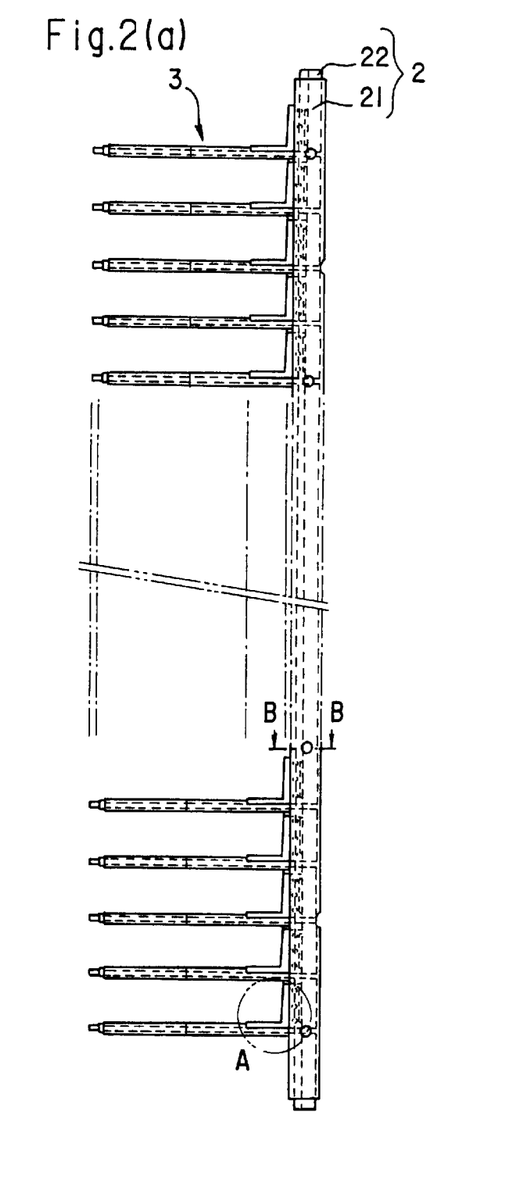
FIGS. 2(a), 2(b) and 2(c) are schematic diagrams showing a second-stage in-process structure for the fabrication of the side panel equipped with elongated ribs.
Figure 2B:
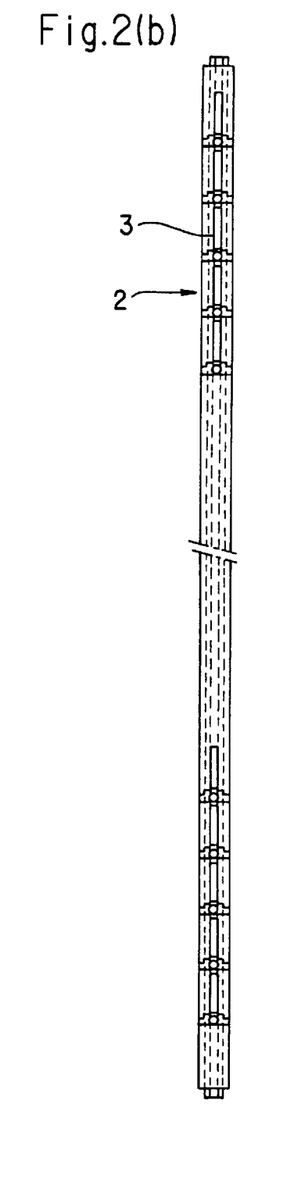
Figure 2C:
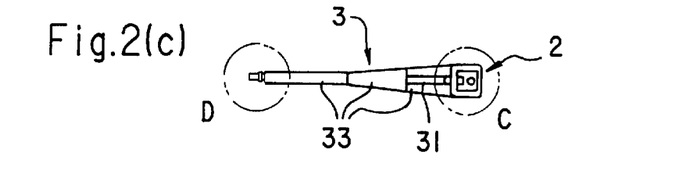

More preferably, as shown in FIGS. 2(a), 2(b) and 2(c), each side panel 2 is a composite structure comprising a side-panel resin body 21 enclosing a metal frame 22. The resin for the side-panel resin body 21 may, for example, be the same resin as is used for the bar-ike elongated intermediate resin body 33 of the elongated rib 3 to be described hereinafter. The metal for the metal frame 22 may, for example, be aluminum or stainless steel.

From the above-mentioned side panels 2, 2, elongated ribs 3 project inwardly of the cassette for supporting substrates B. The substrates B are stowed on, and supported by, the elongated ribs 3.

In accordance with the present invention, either of the following two types of ribs may be used as the elongated rib 3.

The elongated rib 3 of the first type comprises, first, a base resin body 31, secondly, an elongated bar-like intermediate resin body 33 disposed to project from the forward end of the base resin body 31, and, thirdly, a terminal resin body 34 attached to the forward end of said intermediate resin body 33.

The elongated rib 3 of the second type comprises, in addition to the above three members of the elongated rib of the firsttype, a linear reinforcing member 32 that is inserted in the base resin body 31 and extends to the intermediate resin body 33 or the reinforcing member 32 may extend from the base resin body 31 through the intermediate resin body 33 to the terminal resin body 34.

The material of which the linear reinforcing member 32 is made may, for example, be stainless steel or aluminum.

When the elongated rib 3 ofthe first type is comparedwith the elongated rib 3 of the second type, the elongated rib 3 of the second type, which is equipped with the linear reinforcing member 32, is preferred. Although the elongated rib 3 of the first type is lower in strength than the elongated rib 3 of the second type, the former rib can be used depending on the size and weight of substrate B.

In whichever of the elongated rib 3 of the first type and the elongated rib 3 of the secondtype, itis particularlypreferablethatthebaseresinbody 31 comprise aone-piece unit consisting of a horizontal member 31a and a vertical member 31b. The horizontal member 31a and a vertical member 31b of the base resin body 31 may be L-shaped, either upright or inverted, or a sideways T-shape, among others, but the first-mentioned form of the upright L-shape is usually adopted. As attached to the side panel 2, a plurality of elongated ribs 3 present a vertical array of L, L, . . . , a vertical array of T, T. . . each turned sideways, or a vertical array of L, L, . . . each inverted according to the shape of the base resin body 31 chosen. As shown in FIG. 4, when such a one-piece base resin body 31 consisting of horizontal member 31a and vertical member 31b is used, the elongated rib 3 comprises the particular base resin body 31, an intermediate resin body 33 attached to the free forward end of said horizontal member 31a, and a terminal resin body 34 attached to the forward end of the intermediate resin body 33.

In the following description, the construction in which the base resin body 31 is comprised of the horizontal member 31a and vertical member 31b is mainly described. The principal function of the horizontal member 31 is to provide the base for supporting the intermediate resin body 33 which extends therefrom and to support the linear reinforcing member 32. The principal function of the vertical member 3b is to provide the base for mounting the elongated rib 3 on the side panel 2. The vertical member 31b is designed to extend high enough to insure the contact of the edge of substrate B with the vertical member 31b even when the substrate in the cassette sides laterally in a deflected state.

The intermediate resin body 33 is formed to embed at least a lower half of the horizontal member 31a of the base resin body 31 or, alternatively, to embed at least alower half of the horizontal member 31a of the base resin body 31 and at least a portion of the linear reinforcing member 32.

To reduce the area of contact between the elongated rib 3 and the substrate B placed thereon, it is preferable to insure that the top surface of the horizontal member 31a of the base resin body 31 (or the top surface of a member 31a optionally provided on the top surface of said horizontal member 31a) and the top surface of the terminal resin member 34 be situated slightly above the top surface of the bar-shaped intermediate resin body 33.

In apreferred embodiment, eitherthe rear side of the vertical member 31b ofthe base resin body 31 or the rear side of the vertical member 31b of base resin body 31 and the rear end of the linear reinforcing member 32 are inserted into a cooperating groove formed in a metal frame 22 constituting the side panel 2 and rigidly secured to the side panel 2 as embedded in the side-panel resin body 21 constituting the side panel 2.

Disposition ofthe elongated rib 3 in the manner ofproj ecting inwardly of the cassette from the side panels 2, 2 can be achieved typically by following alternative methods. (i) One of such methods comprises fabricating a finished elongated rib 3 of the first type or the second type, inserting the rear side of the vertical member 31b of the base resin body 31 (and the rear side of the linear reinforcing member 32) into the groove formed in the metal frame 22 constituting the side panel 2, and forming the side panel resin body 21 around the metal frame 22 by injection molding. (ii) Another method comprises fabricating the base resin body 31, among the members of the elongated rib 3 ofthe first type or the secondtype (or the base resin body 13 equipped with the linear reinforcing member 32), inserting the rear side of the vertical member 31b of the base resin body 31 (and the rear side of the linear reinforcing member 32) into the groove in the metal frame 22 constituting the side panel 2, and injection-molding the side-panel resin body 21 around the metal frame 22 and, at the same time, the bar-like intermediate resin body 33. This is followed by injection-molding the terminal resin body 34. (iii) Still another method comprises preparing a reinforcing member extending to reach the terminal resin body 34 to serve as the linear reinforcing member 32 for the elongated rib 3 of the second type, molding the base resin body 31 at the base end of the linear reinforcing member 32 and the terminal resin body 34 at the terminal (forward) end thereof in advance, inserting the rear side of the vertical member 31b of base resin body 31 and the rear end of linear reinforcing member 32 into the groove in the metal frame 22, and injection-molding the side panel resin body 21 around the metal frame 22 and, at the same time, the bar-like elongated intermediate resin body 33.

Comparison of these methods (i), (ii) and (iii) indicates that, in terms of productivity and the bond strength between the bar-like intermediate resin body 33 and the side panel resin body 21, the methods (ii) and (iii) are undoubtedly superior to the method (i). The specific procedures will be described in detail hereinafter, in Example 3 for the method (i),in Example 1 for the method (ii), and in Example 2 for the method (iii).

When optionally the vertical member 31b of the base resin body 31 of elongated rib 3 is formed with one or a few through-holes h, the resin used for injection molding of the side-panel resin body 21 enters into the through-holes so that the elongated rib 3 or the base resin body 31 which is a constituent part of the elongated rib 3 can be more securely attached to the side panel 2.

When the effectivewidth ofthe cassette for accommodating substrates is represented by W (mm) and the distance of projection of the elongated rib 3 from the side panel 2 is represented by L (mm), the elongated rib 3 for a cassette having a W value of 400 or more (preferably 600 or more) preferably has an L/W ratio of from $1/10$ to $1/4$ (preferably $1/9$ to $1/4$, more preferably from $1/8$ to $1/4$, particularly $1/7$ to $1/4.5$). When W and L/W are respectively withing the above-mentioned ranges, the deflection of the substrate B is effectively suppressed and there is provided an intermediate space commensurate with the width of the arms of a robot used for cassette loading and unloading. Taking the case of W=560 as an example, L is from 56 to 140 mm. When W is 900 mm, L is from 90 to 225 mm. Incidently, the distance of projection of shelves of the cassette in current use is generally about from 10 to 15 mm and, at longest, about 20 mm.

Referring to the base resin body 31, its horizontal member 31a is disposed in a substantially horizontal position. The angle θ between the top surface of the horizontal member 31a and the front surface of the vertical member 31b may be 90° but is preferably greater than 90° up to about 97°, particularly from 91° to 95°. In Example 1 which appears hereinafter, an angle of 93° is used. Moreover, as shown in FIG. 1(b), the front surface of the vertical member 31b is preferably tapered or convex, with the centerline projecting forwardly with respect to both sides. With these contrivances, the vertical member 31b is slightly flared with respect to the horizontal member 31a so that the loading and unloading of the cassette with substrates (B) by a robot is facilitated and rendered smooth and, moreover, the reduced contact between the vertical member 31b and the edge ofthe substrate B contributes to prevention of dust generation. The vertical sectional configuration of the horizontal member 31a is preferably a vertically elongated oval shape. The horizontal sectional configuration of the vertical oval or rectangular shape (however, the first surface should be a curved surface).

The base resin body 31 is usually made of a slip-resistant resin material including various elastomer resins represented by thermoplastic polyester elastomers and fluorine-containing rubbers. It is also advantageous to use elastomeric non-dust-forming resins or resins having good abrasion resistance (non-filler natural resins) inclusive of polyether ether ketones, polyether imides, polyimides, polyether sulfones, polysulfones, polycarbonates, polyphenylene oxide, polybutylene terephthalate, etc. Incidently, the Taber abrasion index value measured accordingto ASTMD1044 (abrasivewheel: CS-17, load: 1 kg, cycle: 1000 revolutions, temperature: room temperature) varies with different resin grades but, when virgin resins are used, is 7 mg for polyether ether ketones, 10 mg for polyether imides, 13 to 16 mg of polyimides, 11 mg for polyether sulfones, 17 mg for polysulfones, 14 mg for polycarbonates, 17 mg for polyphenylene oxide, and 21 mg for polybutylene terephthalate.

The bar-line intermediate resin body 33 is usually made of a resin having a high strength or high heat resistance, such as polycarbonates, polypropylene, polyether ether ketones, polyether imides, polyimides, polyamide imides, polyphenylene sulfide, polyarylates, polysulfones, polyaryl sulfones, polyether sulfones, polyphenylene ether sulfones, modified polyphenylene oxide, polyetheramides, perfluoroalkoxy-substituted polytetrafluoroethylenes, polybutylene teraphthalate, acronitrile polymers, polyamides, fluororesins, andso on. Such resins in which electrically conductive materials such as metal fiber, metal particles, carbon fiber, carbon black (kitchen black etc.), graphite, ionic polymers, etc. have been incorporated to give a volume resistivity of, for example, $10^4$ to $10^{11}$, particularly $10^5$ to $10^9$, can also be used with advantage. It is also possible to use resins having comparatively small volume resistivities of their own, such as ethylene-vinyl alcohol copolymer. The intermediateresinbody 33 maybetapered, becoming progressively smaller from its base end to its forward end.

The terminal resin body 34 may be made of a resin similar to the resin used for the molding of the base resin body 31, that is to say a non-slip resin such as elastomer resins or an elastomeric non-dust-forming or abrasion-resistant resin (non-filler virgin resin) such as polyether ether ketones, polyether imides, polyimides, polyether sulfones, polysulfones, polycarbonates, polyphenylene oxide, polybutyleneterephthalate, etc. However, otherkinds of resins may likewise be employed.

The member 31a (FIG. 13), which is optionally provided on top of the horizontal member 31a of the base resin body 31, is preferably made of the same material as the base resin body 31 or the terminal resin body 34.

Then, using said frame 1 and the side panels 2 carrying elongated ribs 3, a cassette is assembled. The inlet-outlet side of the cassette may be provided with a stopper means 4 for preventing substrates B from popping out. The substrate B is set on the elongated ribs 3 projecting inwardly from the side panels 2 of the cassette.

The substrate B which can be accommodated in the above cassette includes various rectangular substrates including glass substrates, ceramic substrates, various composite substrates, plastic substrates, etc., especially large-sized glass substrates.

EXAMPLES

The following examples illustrate the present invention in further detail.

Example 1

(First Step)

Figure 1A:
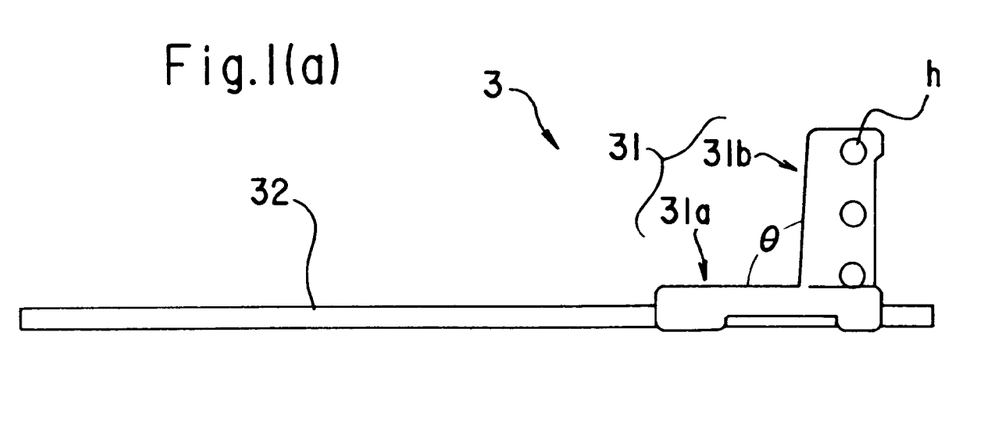
FIGS. 1(a), 1(b) and 1(c) are schematic diagrams illustrating an in-process structure for the fabrication of a cassette side panel equipped with elongated ribs.
Figure 1B:
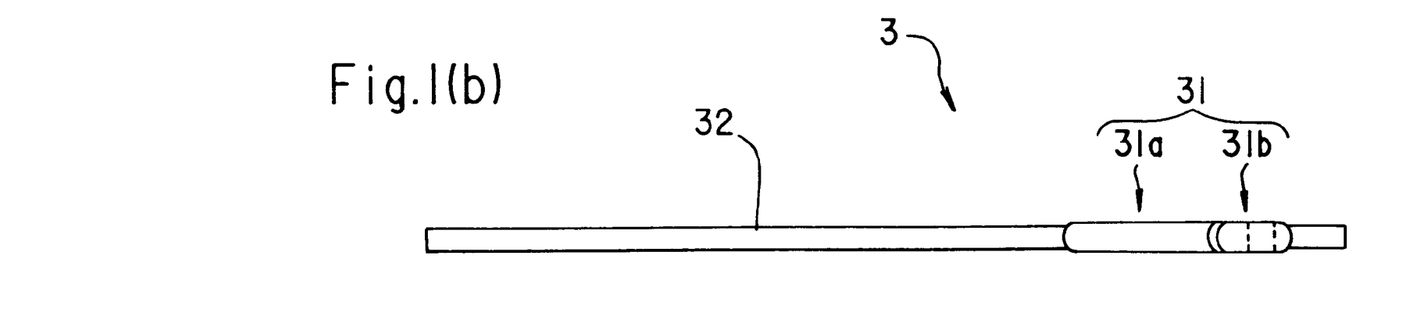
Figure 1C:
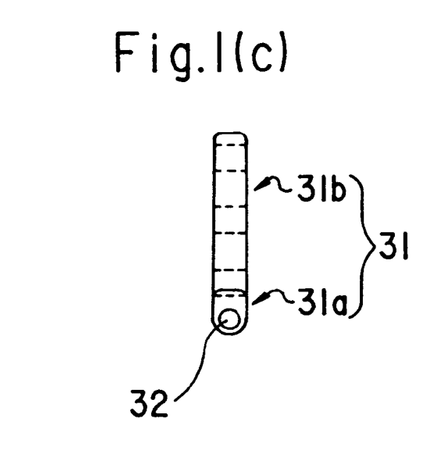

FIGS. 1(a), 1(b) and 1(c) are schematic diagrams illustrating an in-process structure for the fabrication of a side panel 2 equipped with elongated ribs 3. FIG. 1 (a) is a front view, FIG. 1(b) is a plan view, and FIG. 1(c) is a side view. The structure shown in these figures represents a stage in which the base resin body 31 equipped with a linear reinforcing member 32 has been formed.

Using a linear reinforcing member 32 comprising a SUS rod having a diameter of 3 mm as an insert, aresin (e.g., athermoplastic polyester elastomer; Hytrel from DuPont) for the base resin body 31 was injection-molded to prepare an L-configured base resin body 31 consisting of a horizontal member 31a and a vertical member 31b, as shown in FIG. 1 (a) (the L-form turned sideways is shown; the same applies below). The vertical member 31b is provided with three through-holes h. The angle θ between the top surface of the horizontal member 31a and the front surface of the vertical member 31b (the surface facing inwardly of the cassette) was set at 93°. The front end of the vertical member 31b is formed to have a smooth convex surface projecting forwardly along the centerline from both sides as can be seen in FIG. 1(b). The cross-sectional configuration of the horizontal member 31a is a vertically elongated, generally oval shape as illustrated in FIG. 1 (c).

(Second Step)

FIGS. 2(a), 2(b) and 2(c) are schematic diagrams showing a second-stage in-process structure for the fabrication of the side panel 2 equipped with elongated ribs 3; FIG. 2(a) is a front view, FIG. 2(b) is a side view, and FIG. 2(c) is a plan view. In the structure shown in these figures, the base resin body 31 having a linear reinforcing member 32, as shown in FIG. 1, has been secured to the side panel 2 and a bar-like intermediate resin body 33 has then been molded.

Figure 3A:
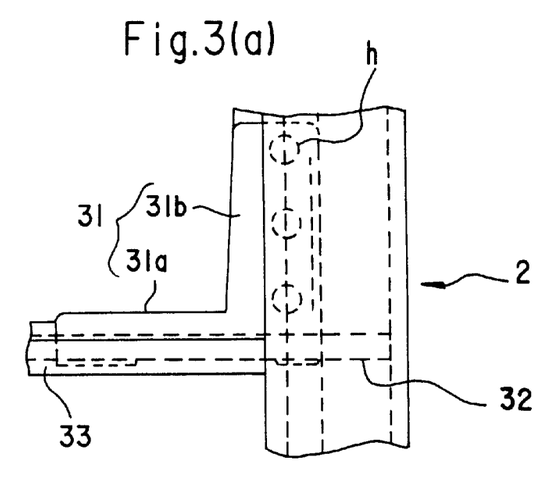
FIGS. 3(a), 3(b), 3(c) and 3(d) are detailed views of the structure shown in FIGS. 2(a), 2(b) and 2(c)
Figure 3B:
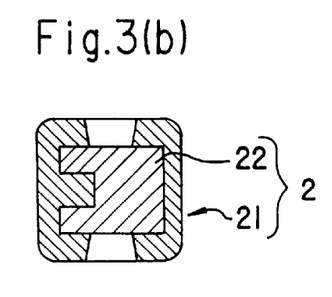
Figure 3C:
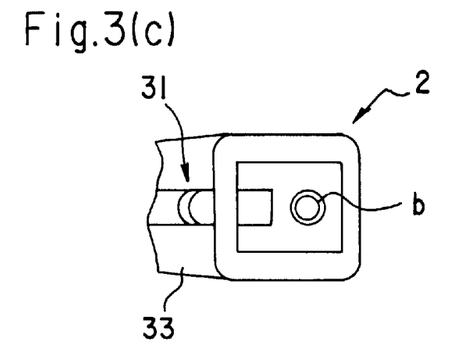
Figure 3D:
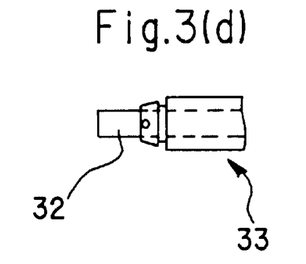

FIGS. 3(a), 3(b), 3(c) and3(d) aredetailedviews ofthe-structureshownin FIG. 2. FIG. 3(a) is an enlarged view of the portion A of FIG. 2(a); FIG. 3(b) is a sectional view taken along the line B-B of FIG. 2(a) (on exaggerated scale); FIG. 3(c) is an enlarged view of the portion C of FIG. 2(c); and FIG. 3(d) is an enlarged view of the portion D of FIG. 2(c). The symbol b in FIG. 3(c) represents a screw hole provided in the metal frame 22 of the side panel 2 for fastening the side panel 2 to the frame 1.

The base resin body 31 equipped with a linear reinforcing member 32 as fabricated in the first step was provided in a plurality of units. The rear side of the base resin body 31 (the rear edge of the vertical member 31b of the L-configured base resin body 31 and the rear end of the linear reinforcing member 32) were inserted into a cooperating groove in the metal (aluminum) frame 22 of the side panel 2 (the innermost part of the groove being formed with a through-hole for accepting the rear end of the linear reinforcing member 32) and the whole assembly was inserted into a metal mold. Then, an injection molding was carried out using a resin material common for the side-panel resin body 21 and intermediate resin body 33 (for example, a carbon fiber-incorporated polycarbonate resin).

By this injection-molding procedure, not only the metal frame 22 and the lower half of the horizontal member 31a ofthe base resin body 31 were covered with the resin, but also the major part of the linear reinforcing member 32, except for a small forward portion thereof, was covered with the resin to produce the side-panel resin body 21 and rod-shaped intermediate resin body 33. In this operation, the molten resin flows into the through-holes h formed in the vertical member 31b of the L-shaped base resin body 31 and fills up the through-holes h. In this matter, the elongated rib 3 component is firmly secured to the side plate 2 and, at the same time, the intermediate resin body 33 is formed (FIGS. 2 and 3). The number of elongated rib components secured to the side panel 2 was 20 and the pitch of the elongated ribs 2 was 30 mm.

(Third Step)

Figure 4A:
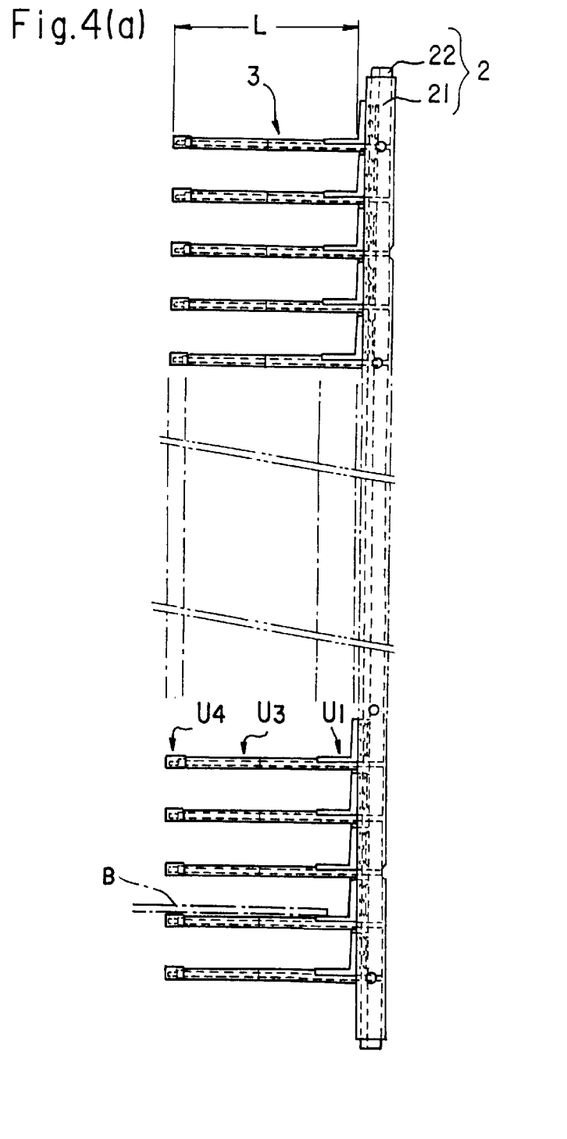
FIGS. 4(a), 4(b), 4(c) and 4(d) are schematic diagrams illustrating a third-stage in-process structure for the fabrication of the side panel equipped with elongated ribs.
Figure 4B:
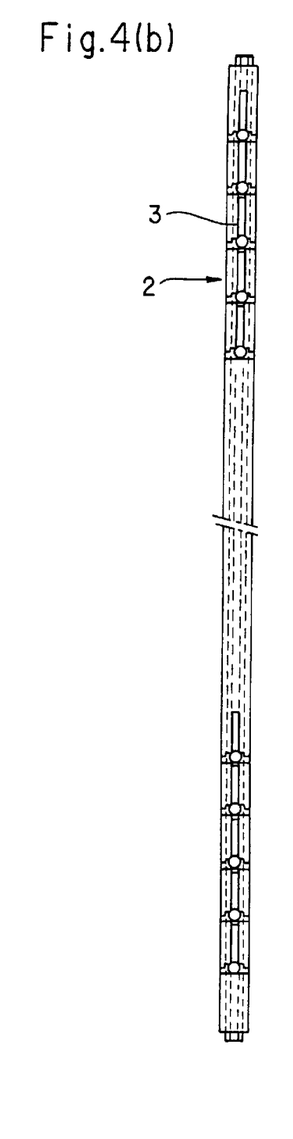
Figure 4C:
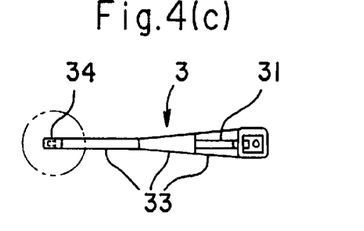
Figure 4D:
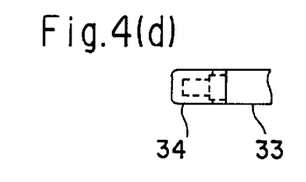

FIGS. 4(a), 4(b), 4(c) and 4(d) are schematic diagrams illustrating a third-stage in-process structure for the fabrication of the side panel equipped with elongated ribs 3. FIG. 4(a) is a front view, FIG. 4(b) is a side view, and FIG. 4(c) is a plan view. FIG. 4(d) is an enlarged view of the encircled portion of FIG. 4(c). The structure shown in FIG. 4 represents a stage in which the terminal resin body 34 has been formed at the forward end of the intermediate resin body 33 of the structure fabricated in the second step.

The structure obtained in the second step was inserted into a metal mold and an injection molding was carried out using a resin for terminal resin body 34 (e.g., a thermoplastic polyester elastomer) to form the terminal resin body 34 forwardly of the intermediate resin body 33 and at the forward end of the linear reinforcing member 32. In this manner, the side panel 2 equipped with elongated ribs 3, as shown in FIG. 4, was obtained.

Referring to FIG. 4(a), in the elongated rib 3 thus obtained, the top surface U of the horizontal member 31a of the base resin member 31 and the top surface $U_4$ of the terminal resin body 34 are situated slightly above the top surface $U_3$ of the elongated rod-shaped intermediate resin body 33, and the top surface U, of the horizontal member 31a and the top surface $U_4$ of the terminal resin body 34 are disposed to contact the substrate B when the cassette is loaded. The distance of projection L. of the elongated rib 3 from the side panel 2 (the distance from the front side of the vertical member 31b of the base resin body 31 reaching the horizontal member 31a to the forward end of the terminal resin body 34) in this embodiment is 106.5 mm.

(Substrate Cassette)

Figure 7:
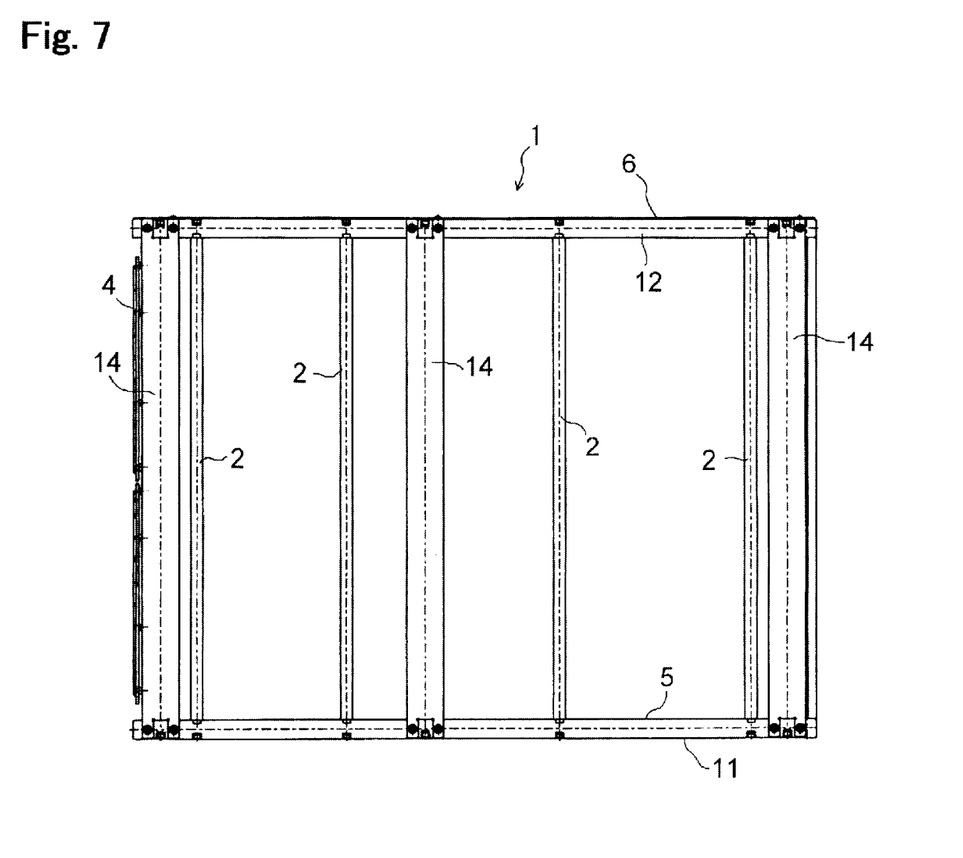
FIG. 7 is aside view ofthe exemplary substrate cassette shown in FIG. 5.
Figure 8A:
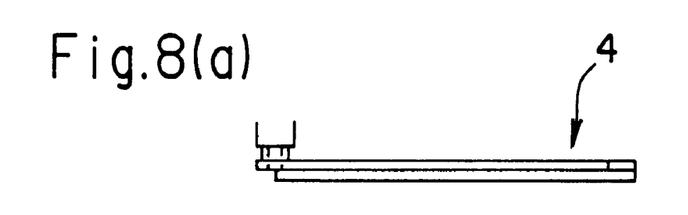
FIGS. 8(a) and 8(b) are top and side views, respectively, showing a stopper means for preventing popping-out of substrates.
Figure 8B:
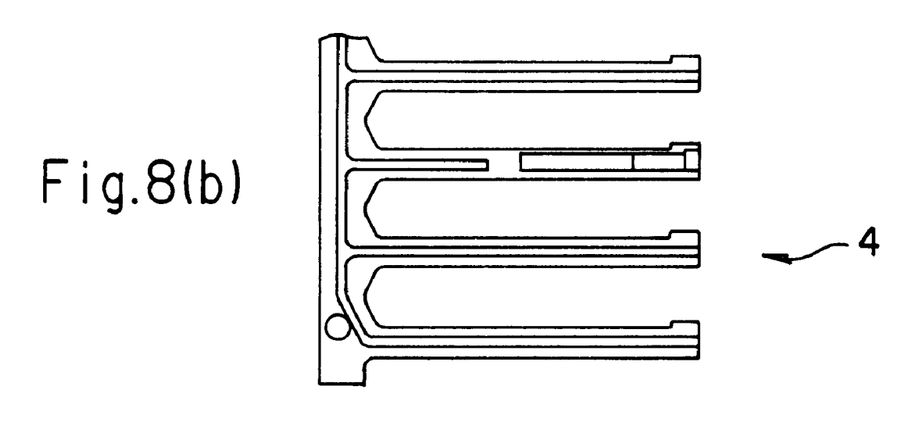

FIG. 5 shows a front view of an exemplary substrate cassette of the present invention;

FIG. 6 is a sectional view taken along the line A-B-C-D of FIG. 5; and FIG. 7 is a side view corresponding to FIG. 5. FIGS. 8(a) and 8(b) are diagrams showing a stopper means 4 for preventing popping-out of substrates.

The frame indicated generally at 1 is a frame consisting of a single bottom frame 11, a single ceiling frame 12, a couple of frame-shaped receiving members 13 and eight supporting frames 14. In this embodiment, the bottom frame 11 and ceiling frame 12 are grid-like structures fabricated by injection-molding of a carbon fiber-containing polycarbonate resin, and the receiving member 13 is a composite of SUS and a polyether ether ketone (virgin). The supporting frame 14 is made of aluminum. As shown in FIG. 5, the receiving member 13 is formed with short ribs 13R at the same pitch as the pitch of the elongated ribs 3 of side panel 2.

Figure 5A:
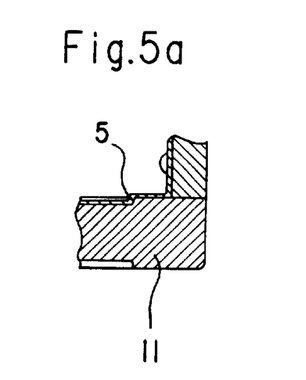
FIG. 5(a) is an enlarged detail of a comer of the frame thereof.

The upper surface of the bottom frame 11 is provided with a cover 5 made of a thin sheet of SUS as better shown in the circle of FIG. 5(a). The upper surface of the ceiling frame 12, as also shown in FIG. 5, is provided with a cover 6 made of a thin sheet of SUS.

As shown in FIG. 6 and in detail in FIGS. 8(a) and 8(b), the stopper 4 for preventing popping-out of the substrate B is optionally provided. The stopper 4 is installed in a total of two units (since each stopper is vertically divided in two, actually a total of four units) at the right and left supporting frames 14 on the cassette loading-unloading side in such a manner that they can be freely opened or closed. In this embodiment, the stopper 4 for preventing popping-out of substrates is made of a polyetherimide (virgin resin) by injection molding. In FIG. 5, the stopper 4 and the elongated rib 3 are shown as overlapped.

In the embodiment wherein an elastomer resin is used for the terminal resin body 34, when the cassette is loaded with the substrate B described below and the cassette is tilted through alarge angle (e.g., 45°) in the direction of lowering the loading side ofthe cassette, no slip-falling of the substrate B occurred even in the absence of the stopper 4.

The side panels 2 are secured between the bottom frame 11 and ceiling frame 12 by means of four screws per panel. The substrate B, represented by a large-sized glass substrate, is placed on the elongated ribs 3 extending from the right and left side panels 2.

After cassette assembling, this substrate B is stowed in the manner shown for one sheet on the second stage from bottom only in FIG. 4(a).

Let it be now assumed that the effective width W of the above cassette is 694 mm, the thickness of the substrate B is 0.7 mm and the width of the substrate B is 680 mm (length: 880 mm). Since the distance of projection L of the elongated rib 3 from the side panel 2 is 106.5 mm as mentioned above, the L/W ratio is 1/6.5.

Figure 9:
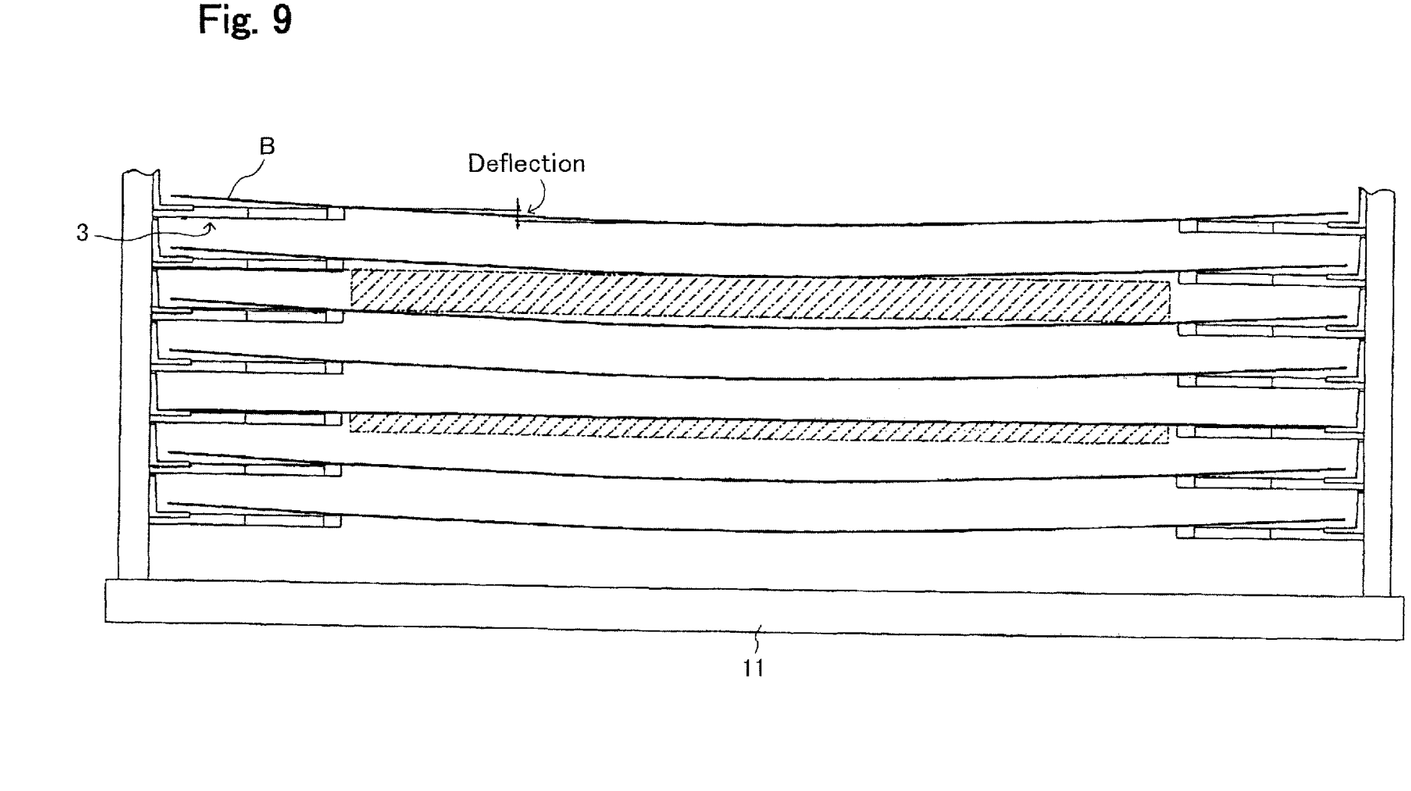
FIG. 9 is a front view illustrating the condition in which the substrate cassette shown in FIG. 5 is loaded with substrates.

FIG. 9 is a front view showing the condition in which the substrate cassette shown in FIG. 5 was loaded with large-sized glass substrates B. The substrates B thus stowed is somewhat deflected.

The substrates B stowed in this cassette are respectively supported by the elongated ribs of the corresponding stages (the innermost part of each substrate B is also supported by the rib 13R of the receiving member 13). Reserved in the center of the cassette is a space necessary for insertion of a robot hand (470 mm wide) for loading and unloading as indicated by two dots-dash lines between the fifth and sixth substrates B from the bottom in 5 FIG. 9. The space indicated by two dots-dash lines immediately below the third substrate B from bottom in FIG. 9 is a release space for unloading by the robot hand.

When a substrate B having a width of 680 mm, a length (depth) of 880 mm and a thickness of 0.7 mm was actually placed on the elongated ribs 3 of the above cassette, the maximum deflection of the substrate B was about 5 mm - up to 6 mm. The vibrations of the substrate B which occurred in loading by the robot or during transport of the cassette were smaller and rapidly spontaneously attenuated.

In contrast, when the conventional cassette of the same size as above, but having grooved side panels equipped with 15 mm - long ribs was loaded with the same substrate B as above, the maximum deflection of the substrate B was more than 20 mm. Moreover, when grooved side panels equipped with 100 mm - long resin rib shelves were used and the same substrate B having a width of 680 mm was placed on the shelves, the maximum deflection was above 7 to 8 mm in static condition but it took a fairly long time for the vibrations to subside after robotized loading or transport of the cassette.

Figure 10A:
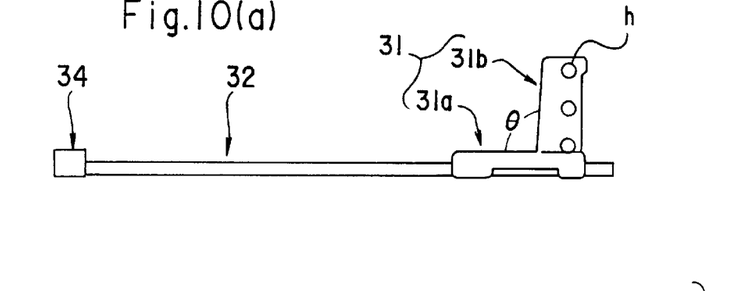
FIGS. 10(a) and 10(b) are schematic diagrams showing another exemplary process for the fabrication of a side panel equippedwith elongated ribs.
Figure 10B:
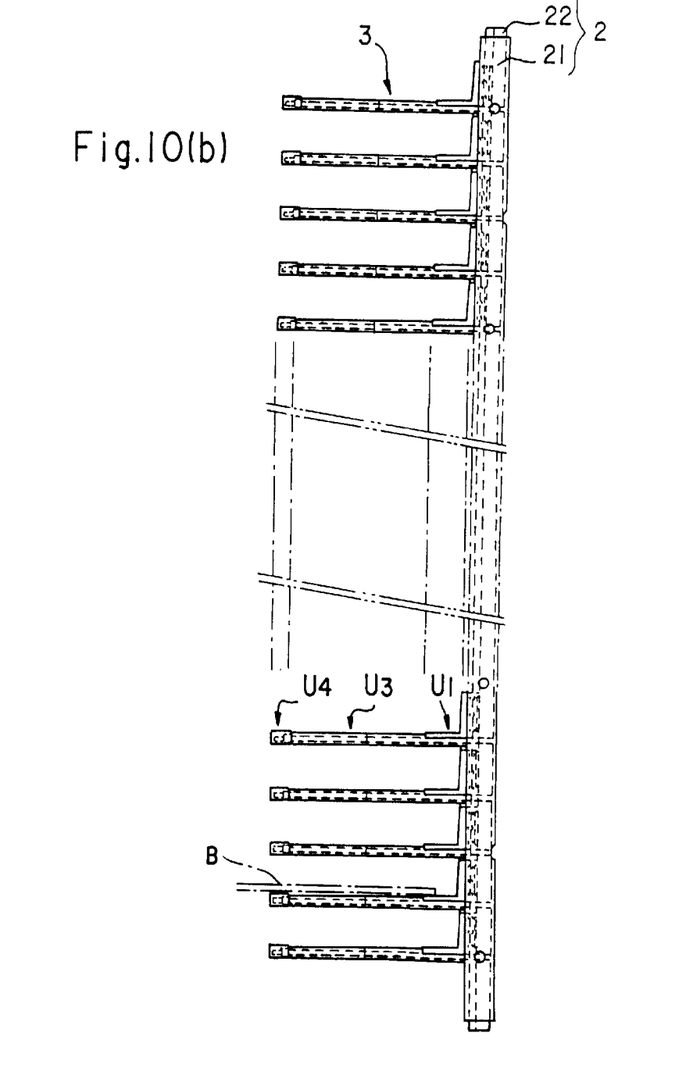

FIGS. 10(a) and 10(b) are schematic diagrams showing another exemplary process for the fabrication of a side panel 2 equipped with elongated ribs 3. In this embodiment, except that the following modifications were made, the procedure of Example 1 was repeated to fabricate a side panel 2 equipped with elongated ribs 3. First, using polyether ether ketones as a resin and the linear reinforcing member 32 as an insert, the base resin body 31 was molded and, at the same time, the terminal resin body 34 was formed at the forward end of the insert to fabricate a plurality of structures [FIG. 10(a)]. The rear side of the base resin body 31 and the rear end of the linear reinforcing member 32 were thereafter inserted into the corresponding groove of the metal frame 22 of the side panel 2. Then, an injection molding was carried out using the resin (a carbon fiber-containing polycarbonate) for both the side panel resin body 21 and the intermediate resin body 33. By this procedure, the metal frame 22 and the lower half of the horizontal member 31a of the base resin and, in addition, the bar-shaped intermediate resin body 33 for covering a portion of the linear reinforcing member 32 was also formed to produce the object side panel 2 equipped with elongated ribs 3 [FIG. 10(b)].

Example 3

Figure 11:
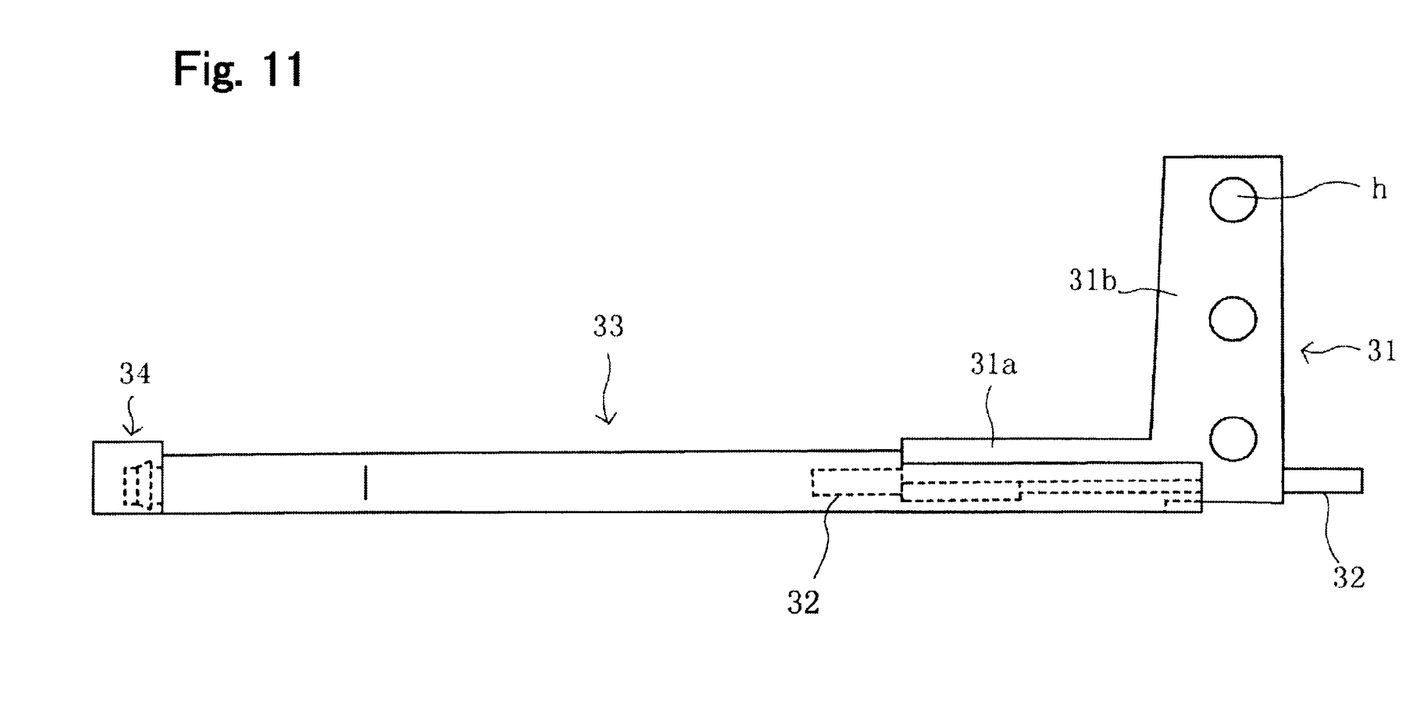
FIG. 11 is a schematic diagram showing an exemplary process for molding elongated ribs.
Figure 12:
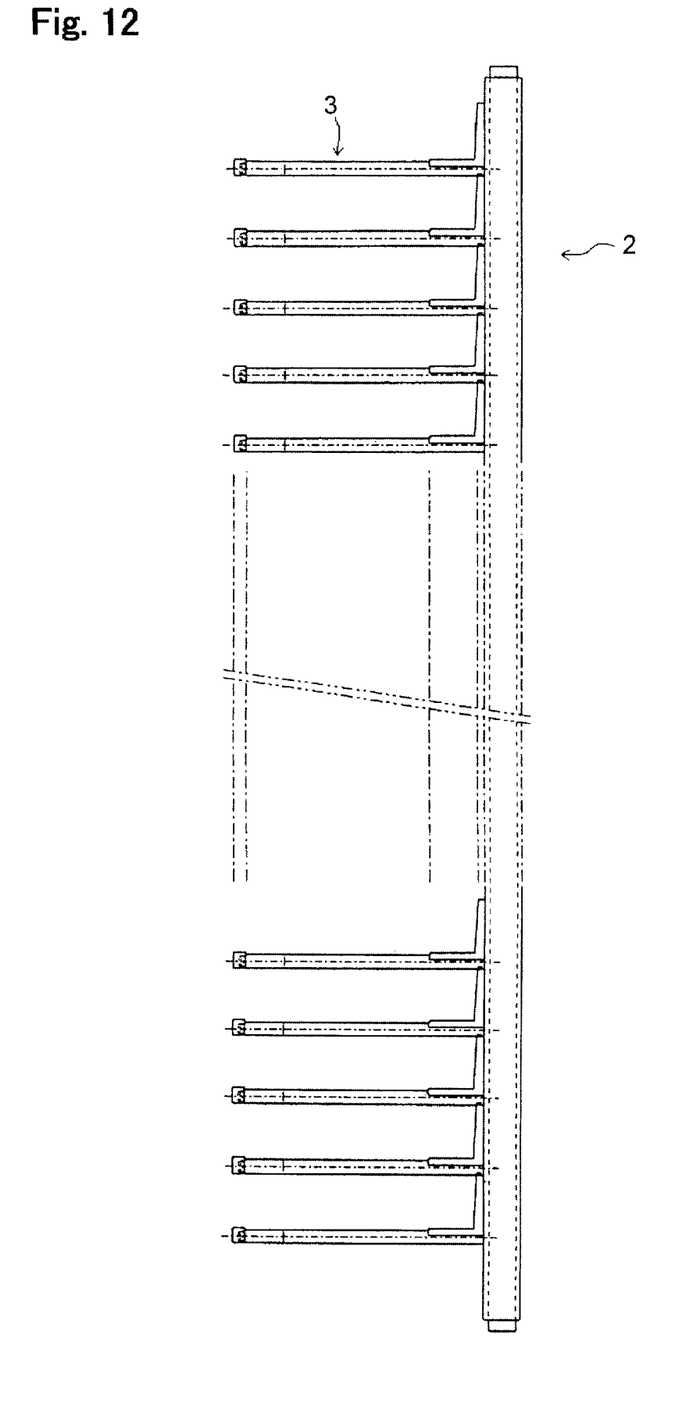
FIG. 12 is a front view showing the elongated ribs of FIG. 11 secured to a cassette side panel.

FIG. 11 is a schematic diagram showing an exemplary process for molding the elongated ribs 3. FIG. 12 is a front view showing the elongated ribs 3 of FIG. 11 as secured to the side panel 2.

In this embodiment, the base resin body 31 provided with the linear reinforcing member 32 was molded in the first step. In the second step, this base resin body 31 carrying the linear reinforcing member 32 was inserted into a metal mold and an injection molding was carried out to form a bar-shaped intermediate resin body 33. Finally, in the third step, the terminal resin body 34 was molded to the front end of the intermediate resin body 33 to complete an elongated rib 3 as an independent unit.

Then, the rear end of the elongated rib 3, thus prepared, was inserted into the corresponding groove of the metal frame 22 and an injection molding was carried out using the resin for formation of the side panel resin body 21. By this procedure, the metal frame 22 and the lower half of the horizontal member 31a of the base resin body 31 were concurrently covered with resin and, at the same time, the rear end portion of the linear reinforcing member 32 was covered. In this manner, the elongated rib 3 was rigidly secured to the side panel 2.

Example 4

Figure 13:
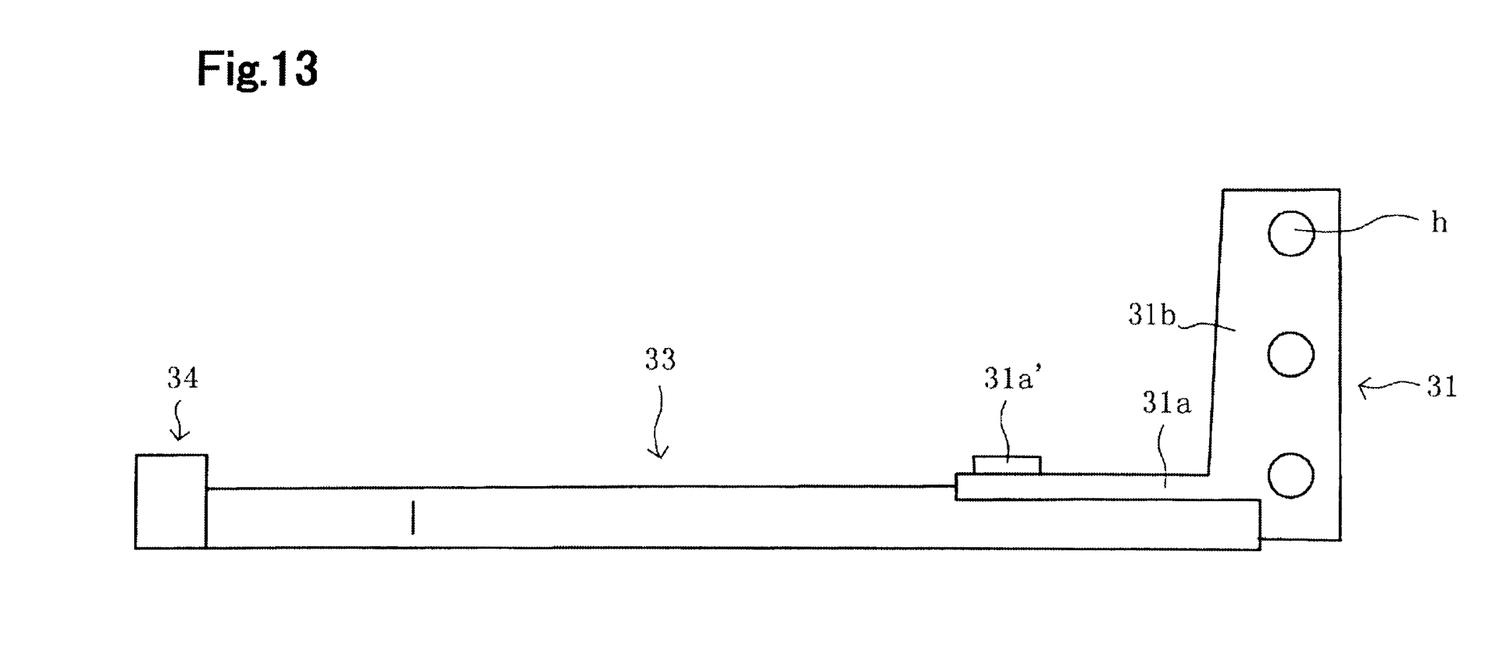
FIG. 13 is a front view showing another example of an elongated rib.

FIG. 13 is a front view showing another example of the elongated rib 3.

In the elongated rib 3 according to Example 4, the linear reinforcing rib 32 was omitted and an elastomer resin member 31a was formed on top of the forward end part of the base resin body 31.

It will be appreciated that the cassette for supporting substrates according to the present invention comprises an elongated rib 3 including a base resin body 31 (preferably having a linear reinforcing member 32 as an insert), a bar-like intermediate resin body 33 and a terminal resin body 34, with the rear side of the base resin body 31 of the elongated rib 3 (and the rear end of the linear reinforcing member 32) having been rigidly embedded in the side panel 2.

When the substrate cassette equipped with a plurality of units having elongated ribs 3 according to the present invention is loaded with substrates b, which may even be larger-sized glass substrates, the deflection of the substrates is so small that the installation pitch of the elongated ribs can be minimized and, moreover, the vibrations of substrates during cassette loading/unloading by a robot or during transport of the cassette are small and subside in a brief time.

What is claimed is:

1. For installation in a cassette for supporting substrates, an elongated rib adapted to project inwardly from each of a pair of opposed sides of a box-shaped skeletal frame of said cassette comprising:
    a base resin body,
    an elongated rod-like intermediate resin body integrated with, and extending from a
    forward end of said base resin body, and a terminal resin body disposed at the forward end of said intermediate resin body.

2. The elongated rib according to claim 1 further comprising a linear reinforcing member inserted in said bodies from said base resin body through said intermediate resin body to said terminal resin body.

3. The elongated rib according to either one of claim 1 or claim 2 wherein said base resin body is a one-piece unit including a horizontal member and a vertical member, said intermediate resin body being disposed at the forward end of said horizontal member and said terminal resin body being disposed at a forward end of said intermediate body.

4. The elongate rib according to claim 3 wherein said intermediate resin body is formed to embed at least a lower half of said horizontal member of said base resin body.

5. The elongated rib according to claim 3 wherein a supporting surface on the horizontal member of said base resin body and the supporting surface of said terminal resin body are disposed at a level above the top surface of said intermediate resin body.

6. The elongated rib according to claim 3 wherein said intermediate resin body is formed to embed at least a lower half of said horizontal member of said base resin body and at least a portion of said linear reinforcing member.

7. A cassette for supporting substrates including a box-shaped skeletal frame having a pair of side panels disposed on a pair of opposed sides, respectively, of said box-shaped frame, and a plurality of elongated ribs projecting inwardly from each of said side panels for supporting substrates by and between the two adjacent elongated ribs, each of said elongated ribs having a structure comprising:
    a base resin body,
    a bar-like intermediate resin body integrated with, and extending from, a forward end of said base resin body, and
    a terminal resin body disposed at a forward end of said intermediate resin body.

8. The cassette for supporting substrates according to claim 7 further comprising a linear reinforcing member inserted in said bodies from said base resin body through said intermediate resin body to said terminal resin body.

9. The cassette for supporting substrates according to either one of claim 6 or claim 8 wherein said base resin body is a one-piece unit including a horizontal member and a vertical member, said intermediate resin body being disposed at the forward end of said horizontal member and said terminal resin body being disposed at a forward end of said intermediate resin body.

10. The cassette for supporting substrates according to either one of claim 7 or claim 8 wherein said side panels is a composite of side panel-forming resin body and a metal frame.

11. The cassette for supporting substrates according to claim 10 wherein the rear edge of the vertical member of the base resin body is inserted into a groove formed in the metal frame constituting said side panel and rigidly embedded in the side-panel resin body constituting said side panel.

12. The cassette for supporting substrates according to either one of claim 7 or claim 8 which satisfies the ratio of L/W=1/10 to 1/4, where W represents the effective width (mm) of the cassette for loading and unloading with substrates and is not less than 400, and L represents the distance (mm) of projection of the elongated ribs from the corresponding side panels.

13. The cassette for supporting substrates according to claim 10 wherein a rear edge of the vertical member of said base resin body and a rear end of said linear reinforcing member are inserted into a groove formed in the metal frame constituting said side panel and rigidly embedded in the side-panel resin body constituting said side panel.

* * * * *